United States Patent [19]
Dittmann

[11] Patent Number: 5,801,930
[45] Date of Patent: Sep. 1, 1998

[54] PRINTED CIRCUIT BOARD RELAY HAVING PUSH-IN CONNECTIONS

[75] Inventor: Michael Dittmann, Berlin, Germany

[73] Assignee: Siemens Aktiengesellschaft, Munich, Germany

[21] Appl. No.: 716,262

[22] PCT Filed: Mar. 21, 1995

[86] PCT No.: PCT/DE95/00384

§ 371 Date: Sep. 24, 1996

§ 102(e) Date: Sep. 24, 1996

[87] PCT Pub. No.: WO95/26036

PCT Pub. Date: Sep. 28, 1995

[30] Foreign Application Priority Data

Mar. 24, 1994 [DE] Germany .................. 44 10 285.2

[51] Int. Cl.[6] .................................................. H05K 7/00
[52] U.S. Cl. .................... 361/819; 361/760; 361/772; 361/773; 361/776; 335/202; 335/278
[58] Field of Search .............................. 361/819, 781, 361/626, 760, 773, 772, 776; 200/17 R; 335/78, 202, 278; 439/751, 82; 257/692, 693

[56] References Cited

U.S. PATENT DOCUMENTS 3,783,433  1/1974  Kurtz et al. .
4,336,431  6/1982  Loose .

FOREIGN PATENT DOCUMENTS 1281357   1/1962   France .
3318135   11/1984  Germany .
3430589   2/1986   Germany .
8431966.6 5/1986   Germany .

*Primary Examiner*—Leo P. Picard
*Assistant Examiner*—Phuong T. Vu
*Attorney, Agent, or Firm*—Hill & Simpson

[57] ABSTRACT

In the case of the relay, connecting elements which are anchored in the base body are passed out of the base body (1) at the side and are bent at right angles to the base plane as push-in posts (12). The push-in posts (12) are formed by sections which are rolled in in the form of sleeves or channels are bent outwards from the contour of the relay structure with an axis at right angles to the base plane and form pushing-in shoulders (14) with their respective upper edge.

8 Claims, 3 Drawing Sheets

PRINTED CIRCUIT BOARD RELAY HAVING PUSH-IN CONNECTIONS

BACKGROUND OF THE INVENTION

1. Field of the Invention

The present invention relates to a printed circuit board relay having a base body, in which connecting elements which are cut from a sheet-metal panel are embedded essentially parallel to a base plane of the relay, which connecting elements project sideways from the base body and are bent downwards on its outer side in order to form push-in posts which are at right angles to the base plane.

2. Description of the Related Art

Such a relay has already been disclosed, in general form, in German Patent Document DE 34 30 589 C2. The push-in posts are in this case integrally formed on the contact elements of the relay simply by bending, the elastic push-in zone having limbs which are divided from one another and are pressed apart from one another by means of a longitudinal slot.

When solder-free contact is made with the relay via push-in posts on a printed circuit board, in order to ensure in addition that this contact-making is gastight and reliable, the push-in zone must be able to produce a specific contact pressure in the contact holes of the printed circuit board which, in turn, is predicated on a corresponding insertion force during assembly. In order now to make it possible to absorb and transmit this insertion force, the push-in posts according to the prior art indicated above require a specific minimum material thickness; otherwise, the risk exists that the push-in posts will be kinked by the insertion force. Since the connecting elements are normally formed integrally from the sheet-metal material of the contact elements, but the sheet-metal thickness of the contact elements is frequently very small in the case of miniature relays, for example being only 0.2 mm, the required stiffness is not directly ensured for push-in posts which are formed from this material.

German Patent Document DE-U-84 31 966 discloses a contact spring for electrical plug connector strips, whose connecting tab is designed in a V-shape in the insertion region, pushing-in shoulders being provided symmetrically on relatively small broadened regions of the two limbs. These pushing-in shoulders can transmit insertion forces reliably if the material thickness of the contact spring is adequate and the insertion tool can act relatively closely on both sides alongside the contact spring. These conditions are present in the case of plug connectors, but not in the case of a relay of the type mentioned initially.

U.S. Pat. No. 4,336,431 furthermore presents solder-free fixing of a spring sheet-metal element on a printed circuit board, spring elements which are in each case bent in a U-shape being secured by insertion into holes in the printed circuit board and by subsequent deformation by upsetting. These U-shaped spring elements admittedly have flaps bent in a groove shape on both sides and have push-in shoulders on their top, but they are not push-in posts in the actual sense, since the U-shaped spring elements do not make contact in the printed circuit board holes. Since the spring sheet-metal elements are used without any extrusion coating or housing enclosure, this design can also not be transferred to making contact with the switching contacts, which are embedded in a base body, of a relay.

SUMMARY OF THE INVENTION

An object of the present invention is to provide push-in posts in the case of a printed circuit board relay of the type mentioned initially such that, even with a small material thickness, they have adequate stiffness to produce the required contact pressure in the push-in zone, and such that the post itself can transmit the insertion force required for this purpose to the push-in zone.

This and other objects are achieved according to the invention in the case of a relay of the type mentioned initially in that the push-in posts are formed by sections which are bent in the form of sleeves or channels and are in each case linked on one side to that section of the respective connecting element which is bent downwards at right angles, having an axis which is at right angles to the base plane, in such a manner that the center of the sleeve or channel is in each case offset with respect to this section, and at least one limb of the sleeve or channel is located outside the contour of the relay base body, the upper edge of the sleeve or channel forming a pushing-in shoulder.

In the case of the invention, the push-in posts are thus no longer only cut from the sheet-metal material of the connecting elements as flat strips but are formed by bending around a longitudinal axis to produce a sleeve which is closed to a greater or lesser extent, or to produce a groove or channel with a U-shaped or V-shaped cross section, as a result of which the stiffness is considerably increased. In the case of this channel form, the push-in zone itself obtains its elasticity not only by two thin limbs on both sides of a slot, but by the entire body of the channel or sleeve, which is intrinsically resilient.

The upper rim of the sleeve or channel which forms the respective push-in post is used as a pushing-in shoulder which lies essentially outside the outer contour of the rest of the relay structure, so that these pushing-in shoulders are accessible for a push-in die acting at right angles. This is achieved by linking the sleeve or channel on one side to the bent section of the connecting element, as a result of which the center of the sleeve is offset with respect to this section and at least one limb of the sleeve or channel is located outside the contour of the relay base body. As a result of this offset of the major part of the push-in post with respect to that section of the connecting element which emerges from the base body, the section is more easily accessible for an insertion tool. In particular, the pushing-in shoulder is formed above the bent and thus stiffest region of the groove; it is thus possible to press from above onto this pushing-in shoulder, approximately centrally with respect to the push-in post which is in the form of a channel, using the push-in die.

In this case, the push-in die can press directly onto the individual push-in posts; however, it is also possible to form a side rim strip integrally on a housing cap, which rim strip transmits the insertion force to the individual pushing-in shoulders. Alternatively, it would be conceivable for the pushing-in shoulders to be embedded with the immediately adjacent upper region of the push-in posts into a rim strip of the relay base body, and thus to provide additional stabilization.

In order to further increase the stiffness in the case of particularly thin sheet-metal material, it is also possible to obtain twice the material thickness by folding the metal sheet in the region of the push-in posts, so that the sleeve or channel which is then produced has a double-walled casing.

BRIEF DESCRIPTION OF THE DRAWINGS

The invention will be explained in more detail in the following text using an exemplary embodiment and with reference to the drawing, in which.

DETAILED DESCRIPTION OF THE PREFERRED EMBODIMENTS

Figure 1:
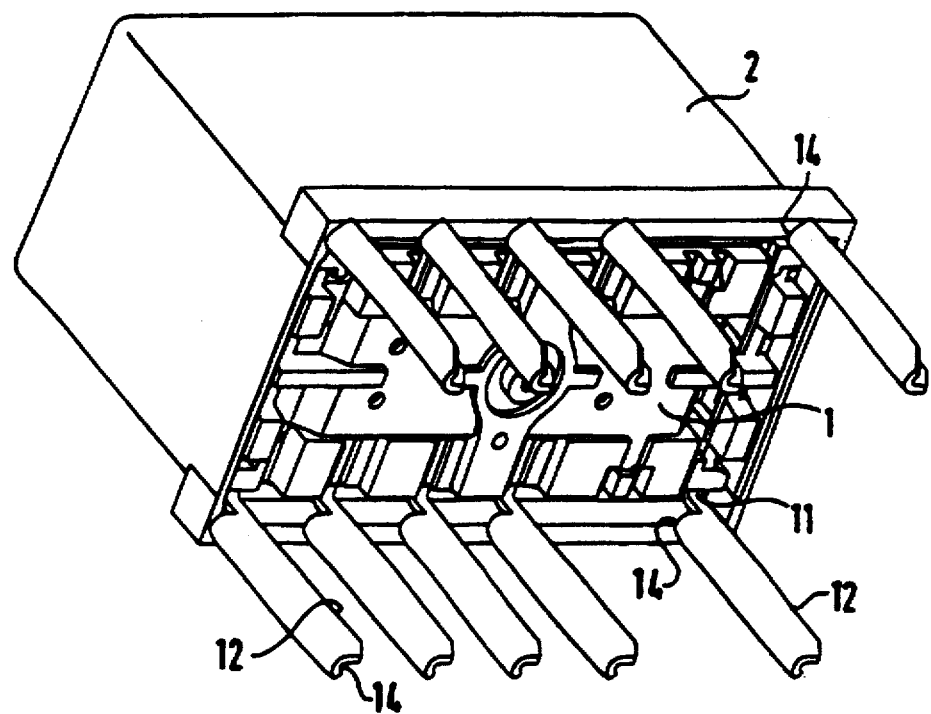
FIG. 1 shows a perspective view of a relay designed according to the invention, as seen from the bottom.

The relay which is illustrated in the drawings has a housing which comprises a base 1, which is used as a base body, and a housing cap 2. A sheet-metal panel 3 (see FIG. 3) is embedded in the base, essentially parallel to the base plane. Various fixed contact elements 4 and support connections 5 for moving contact elements 6 are bent upwards into the relay interior from the sheet-metal panel 3. These moving contact elements 6 are connected via a dielectric support 7 to an armature 8 which is part of a magnet system, which has a coil 9 and a permanent magnet 10. This relay structure, as is presented in section in FIG. 3 and FIG. 4, is known per se, and it is therefore not intended to describe it in more detail here.

Figure 2:
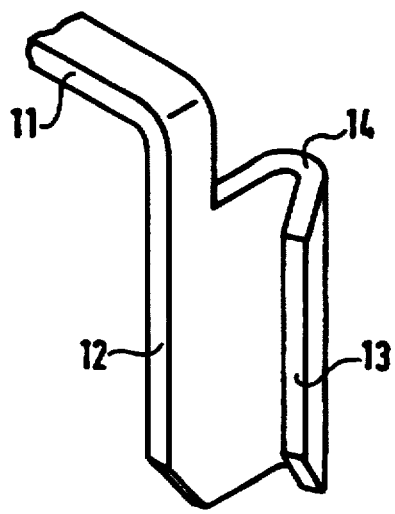
FIG. 2 shows a detailed view of an individual push-in post.

In order to make contact with the relay on a printed circuit board 10, connecting elements 11 are also integrally formed on the sheet-metal panel 3, emerge from the base 1 in each case at the side of the relay system and are bent downwards in order to form push-in posts 12 which are at right angles to the base plane. The connecting elements 11 are anchored in a longitudinal web in the base body 1. As can be seen in FIG. 1 and in FIG. 2, these push-in posts 12 are bent with an additional limb 13 a channel, so that a push-in zone is produced having a U-shaped or V-shaped cross section. Further rolling in would also be conceivable, to form a sleeve which is closed to a greater or lesser extent. The upper rim of the push-in post is used as a pushing-in shoulder 14, which lies outside the housing contour of the relay and is thus accessible for an insertion tool having dies (see FIG. 3). These dies 15 press in the direction of the arrows 16 onto the pushing-in shoulders 14 and thus press the push-in zones into the contact holes 17 of the printed circuit board 10.

The push-in posts 12 are in this case asymmetrically coupled to the connecting element, one limb of the respective push-in post being integrally formed on one side on the bent section of the connecting element 11 and, at its outer end, the second limb 13 running outwards over the V-shaped bend. In this way, the pushing-in shoulder 14 is formed over the particularly stiff center region of the push-in post, which is in the form of a channel, and, as a result of the offset to the junction point, can also be pressed approximately centrally onto this stiff section using the push-in die.

Figure 3:
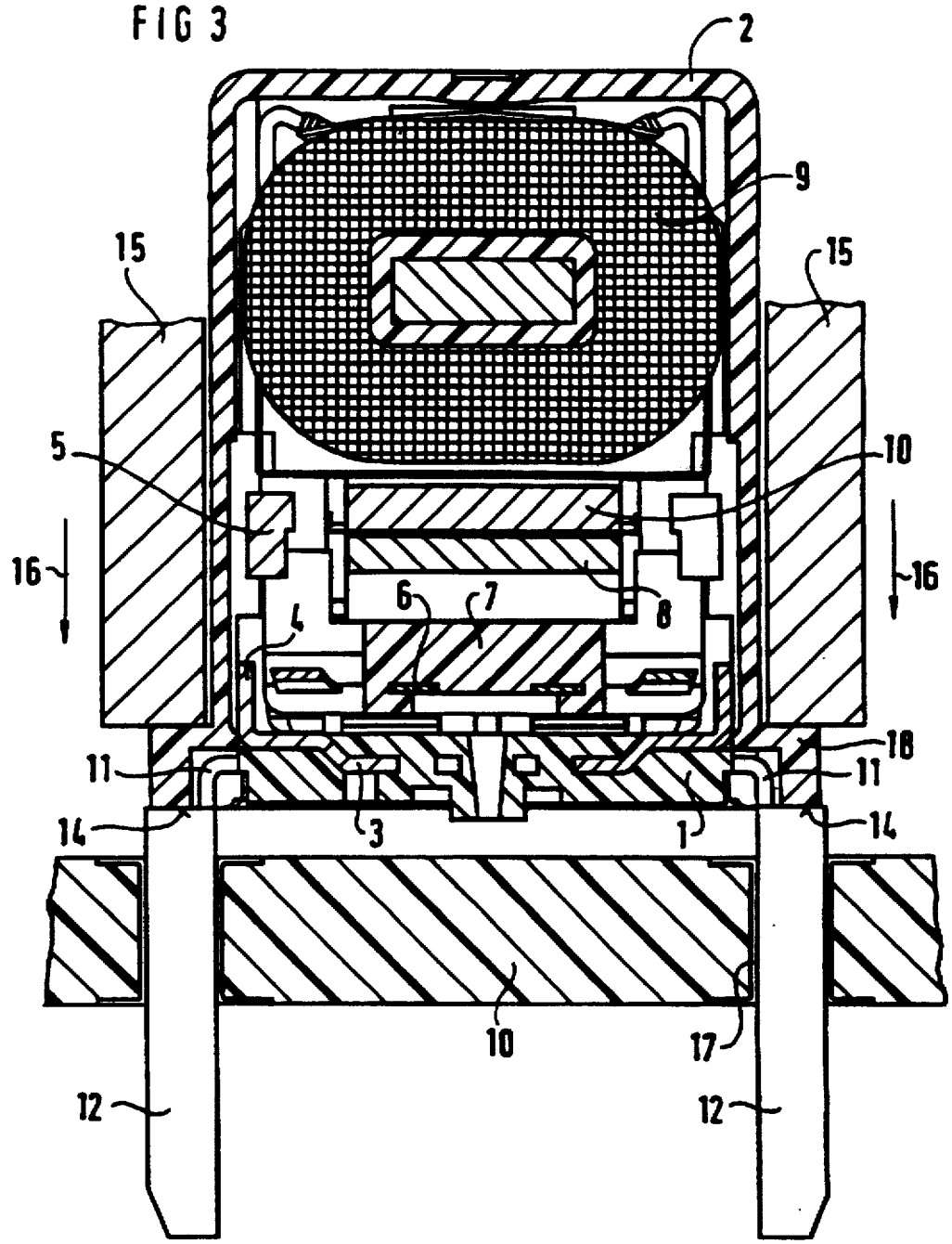
FIG. 3 shows a section through a relay according to FIG. 1, while it is being pushed into a printed circuit board.
Figure 4:
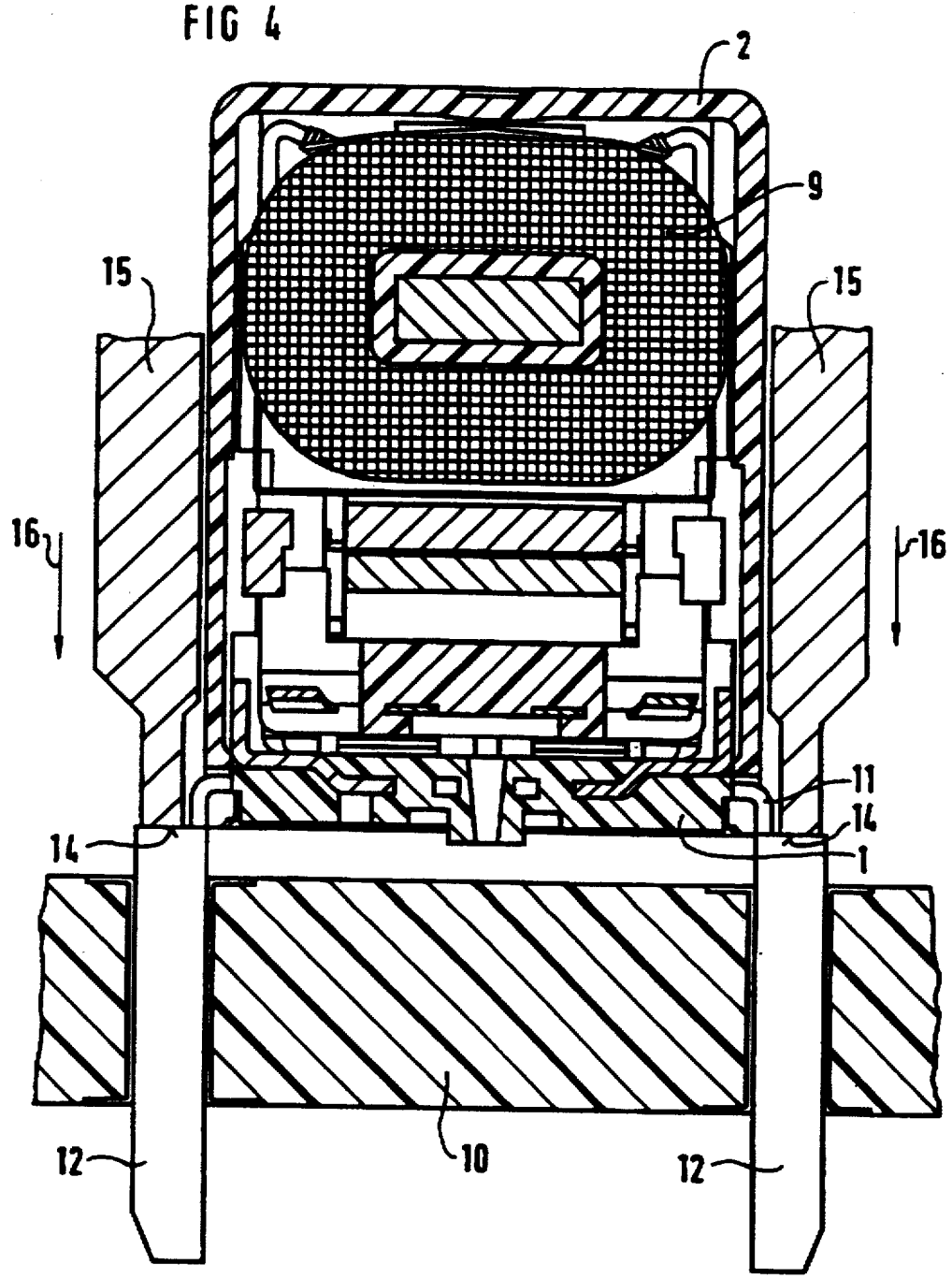
FIG. 4 shows a section corresponding to FIG. 3 with a somewhat modified form of the relay housing.

In the case of the embodiment according to FIG. 3, the housing cap 2 has in each case one integrally formed rim strip 18 on its lower rim, which rim strip 18 transmits the insertion force of the dies 15 onto the pushing-in shoulders 14. According to the embodiment in FIG. 4, this rim strip can also be omitted, so that the push-in dies 15 act directly on the pushing-in shoulders 14 of the push-in posts.

Although other modifications and changes may be suggested by those skilled in the art, it is the intention of the inventor to embody within the patent warranted hereon all changes and modifications as reasonably and properly come within the scope of his contribution to the art.

I claim:

1. A connecting arrangement in a printed circuit board relay, comprising: a base body defining a base plane of the relay;

connecting elements which are cut from a sheet-metal panel being embedded in said base body essentially parallel to said base plane of the relay, said connecting elements projecting sideways from said base body and being bent downwards on its outer side;

push-in posts connected to said outer side of said connecting elements which are at right angles to said base plane, said push-in posts each including a channel-shaped sections having a bend along a longitudinal axis, the push-in posts are each linked at a top end to said outer side of the respective connecting element, said longitudinal axis of each of said push-in posts being at right angles to the base plane, a center of each of said push-in posts being offset with respect to said outer side of said connecting element, and at least one portion of said channel-shaped sections being located outside a contour of said base body, a pushing-in shoulder at an upper edge of said channel-shaped sections.

2. A connecting arrangement as claimed in claim 1, wherein said channel-shaped sections of said push-in posts are bent to have a V-shaped cross section.

3. A connecting arrangement as claimed in claim 1, further comprising:

a housing cap for the relay extending over said base body;

an outwardly projecting rim on said housing cap, said outwardly projecting rim being a pressure strip disposed on said pushing-in shoulders so as to conduct pressure from said housing cap to said push-in posts.

4. A connecting arrangement as claimed in claim 1, further comprising:

a housing cap for the relay extending over said base body, said pushing-in shoulders being exposed outside a contour of said housing cap.

5. A connecting arrangement as claimed in claim 1, wherein said base body includes a longitudinal web in which said connecting elements of said push-in posts are anchored adjacent to said pushing-in shoulder, said longitudinal web being integrally formed at a side of said base body.

6. A connecting arrangement as claimed in claim 1, wherein said connecting elements are of a metal sheet of a material thickness, said push-in posts being of twice the material thickness by said metal sheet being folded.

7. A connecting arrangement as claimed in claim 1, wherein said channel-shaped sections of said push-in posts are bent around to form a sleeve.

8. A connecting arrangement as claimed in claim 1, wherein said channel-shaped sections of said push-in posts are bent to have a U-shaped cross section.

* * * * *